United States Patent
Bin Mohd Arshad et al.

(10) Patent No.: US 11,562,929 B2
(45) Date of Patent: *Jan. 24, 2023

(54) SAWN LEADLESS PACKAGE HAVING WETTABLE FLANK LEADS

(71) Applicant: TEXAS INSTRUMENTS INCORPORATED, Dallas, TX (US)

(72) Inventors: Mohamad Ashraf Bin Mohd Arshad, Kuala Lumpur (MY); Soo Wai Kong, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 41 days.

This patent is subject to a terminal disclaimer.

(21) Appl. No.: 16/953,176

(22) Filed: Nov. 19, 2020

(65) Prior Publication Data

US 2021/0074587 A1    Mar. 11, 2021

Related U.S. Application Data

(60) Division of application No. 16/141,807, filed on Sep. 25, 2018, now Pat. No. 10,879,121, which is a
(Continued)

(51) Int. Cl.
*H01L 21/78*     (2006.01)
*H01L 23/495*    (2006.01)
*H01L 21/48*     (2006.01)
*H01L 21/56*     (2006.01)
*H01L 23/31*     (2006.01)

(52) U.S. Cl.
CPC .......... *H01L 21/78* (2013.01); *H01L 21/4842* (2013.01); *H01L 21/561* (2013.01); *H01L 21/565* (2013.01); *H01L 23/49548* (2013.01); *H01L 21/4828* (2013.01); *H01L 23/3107* (2013.01); *H01L 2224/48091* (2013.01); *H01L 2224/48247* (2013.01);
(Continued)

(58) Field of Classification Search
None
See application file for complete search history.

(56) References Cited

U.S. PATENT DOCUMENTS

| 6,040,623 A | 3/2000 | Chan et al. |
| 6,420,779 B1 | 7/2002 | Sharma et al. |

(Continued)

*Primary Examiner* — Michelle Mandala
(74) *Attorney, Agent, or Firm* — Dawn Jos; Frank D. Cimino

(57) ABSTRACT

A method of forming a leadless packaged semiconductor device. First partial sawing leads is performed on a bottom side of an in-process leadless semiconductor package having a leadframe including die pad with a semiconductor chip thereon, and leads defining top and bottom surfaces and having an inner end and an outer end having a bottom corner region. Conductive bond wires connect to and extending between bond pads on the chip and respective leads, a mold compound is around the die pad, leads, chip, and conductive bond wires while exposing the bottom surface and outer end. The first sawing completely severs the leads while forming only a partial cut in the mold compound. A de-flash process is applied to the bottom side. The second sawing aligned to the partial cuts reaches the partial cuts to complete singulation of the package, wherein the second sawing does not touch the leads.

11 Claims, 4 Drawing Sheets

Related U.S. Application Data continuation of application No. 15/220,782, filed on Jul. 27, 2016, now Pat. No. 10,083,866.

(52) U.S. Cl.
CPC ............... *H01L 2224/48465* (2013.01); *H01L 2224/73265* (2013.01); *H01L 2924/181* (2013.01)

(56) References Cited

U.S. PATENT DOCUMENTS

| | | | |
|---|---|---|---|
| 6,608,366 | B1 | 8/2003 | Fogelson et al. |
| 10,083,866 | B2 * | 9/2018 | Bin Mohd Arshad ....................... H01L 21/561 |
| 2005/0029638 | A1 | 2/2005 | Ahn et al. |
| 2005/0260795 | A1 | 11/2005 | Park et al. |
| 2006/0043566 | A1 | 3/2006 | Nakanishi |
| 2010/0289128 | A1 | 11/2010 | Camacho et al. |
| 2012/0306065 | A1 | 12/2012 | Bin Mohd Arshad |
| 2014/0264789 | A1 | 9/2014 | Yang et al. |
| 2014/0264798 | A1 | 9/2014 | Otremba et al. |
| 2015/0132868 | A1 | 5/2015 | Khoo et al. |
| 2016/0211197 | A9 | 7/2016 | Groenhuis et al. |
| 2016/0225642 | A1 | 8/2016 | Pai |
| 2016/0254214 | A1 | 9/2016 | Makino |
| 2016/0268167 | A1 | 9/2016 | Matsuura et al. |
| 2017/0256509 | A1 | 9/2017 | Lee et al. |

* cited by examiner

SAWN LEADLESS PACKAGE HAVING WETTABLE FLANK LEADS

CROSS-REFERENCE TO RELATED APPLICATIONS

This application is a divisional of and claims the benefit to U.S. patent application Ser. No. 16/141,807 filed on Sep. 25, 2018 which is a continuation of and claims the benefit to U.S. patent application Ser. No. 15/220,782 filed on Jul. 27, 2016, now U.S. Pat. No. 10,083,866 granted Sep. 25, 2018, the contents of all are incorporated herein by reference.

FIELD

Disclosed embodiments relate to wettable flank lead designs for leadless semiconductor packages.

BACKGROUND

A variety of semiconductor chip packages are known that provide support for an semiconductor die (e.g., integrated circuit (IC) chip) and associated bond wires, provide protection from the environment, and enable surface mounting of the die to and interconnection to a printed circuit board (PCB), typically with solder joints. For purposes of high-volume, low-cost production of chip packages, a conventional semiconductor industry practice is to etch or stamp a thin sheet of metal material to form a panel or strip which defines multiple leadframes. A single strip may be formed to include multiple 2D arrays, with each such array including a plurality of leadframes in a particular pattern. In a typical chip package manufacturing process, the integrated circuit (IC) dies are mounted and then wire bonded to respective ones of the leadframes, then an encapsulant material (or mold compound) is applied to the strip so as to encapsulate the IC dies, bond wires, and portions of each of the leadframes.

Upon the hardening of the encapsulant material, the leadframes within the strip are cut apart or singulated for producing individual chip packages. Such singulation is typically accomplished via a sawing process. In a conventional mechanical saw process, a saw blade (or dicing blade) is typically advanced along "saw streets" which extend in prescribed patterns between the leadframes to separate the leadframes from one another.

To insure that every solder joint between the leads of a package and lands on the PCB has been fully wetted by solder an option exists to enable visually inspecting if proper solder connections exist. The "wettable flank" lead design option allows for the solder to wick up the edge of the package which is needed for visual inspection because unlike traditional leaded components such as Small Outline Integrated Circuit (SOIC) and dual-in-line (DIP) packages, the solder joints of leadless packages such as Quad Flat No-Lead (QFN) packages are formed primarily underneath the package. In the wettable flank option at least one of the top corner region and a bottom corner region of the outer edge of the leads is utilized to form a recess which is sized and configured to accommodate reflowing solder therein to enable a visual solder inspection after assembly to a package substrate such as a PCB.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize although known wettable flank lead designs including corner half-etch recesses (or lead slots) is one of the most inexpensive solutions for providing solder joint inspectability for safety critical leadless packaged devices such as Quad Flat No-Lead (QFN) packages, the package sawing used for singulation generates metal (e.g., copper) slivers (or "burrs" as generally used herein). Such burrs can accumulate preferentially inside the recesses. Moreover, some customer applications are sensitive to presence of such burrs on the package leads, with the result being a degradation in board level reliability (BLR). Disclosed embodiments describe an assembly flow that removes the burrs generated by sawing on the leads and in the leads (for leads with a recess) for leadless packages including using a new 2-cut assembly flow. Disclosed assembly flows address the problem of burrs, while for leads with a recess still providing wettable flank leads that fulfill the wetable flank requirement.

Disclosed 2-cut package saw processing separates the conventional single package saw process for package singulation into a lead saw processes on the lead side (bottom side) of the package that cuts completely severing the leads and only partially through the thickness of the mold compound, referred herein as being "partial cuts". The second package saw on the top side of the package is aligned to the partial cuts on the bottom side and cuts to reach the partial cuts to provide singulation. The de-flash process for removing the burrs is positioned between the lead saw process and the package saw process to remove the burrs. In the case of leads having a recess, the burrs may be preferentially trapped inside the recesses.

BRIEF DESCRIPTION OF THE DRAWINGS

Reference will now be made to the accompanying drawings, which are not necessarily drawn to scale, wherein.

DETAILED DESCRIPTION

Figure 1A:
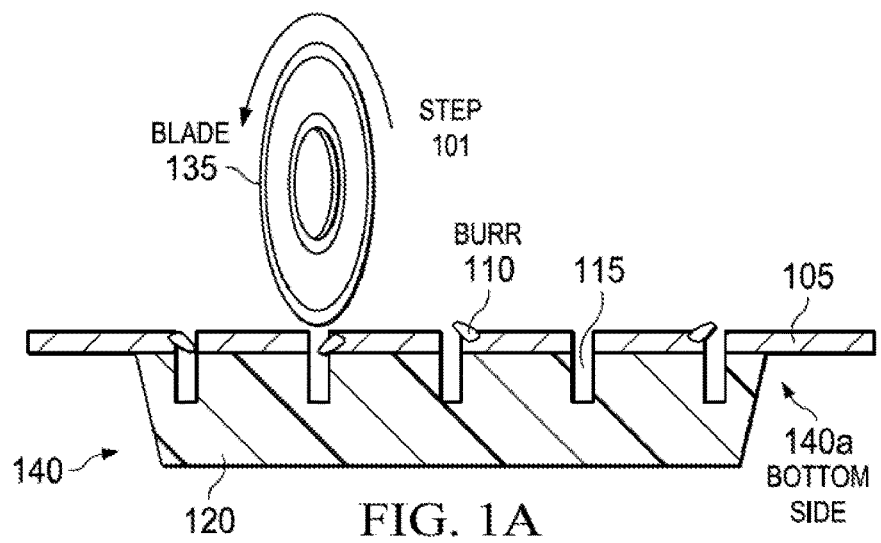
FIGS. 1A-1C depicts steps in an example 2-cut method of sawing for singulation for a leadless packaged semiconductor device, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
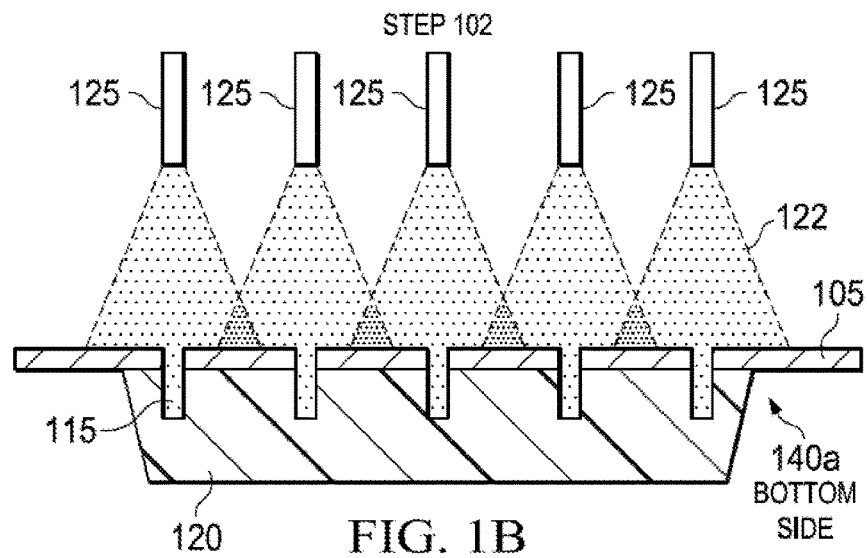
Figure 1C:
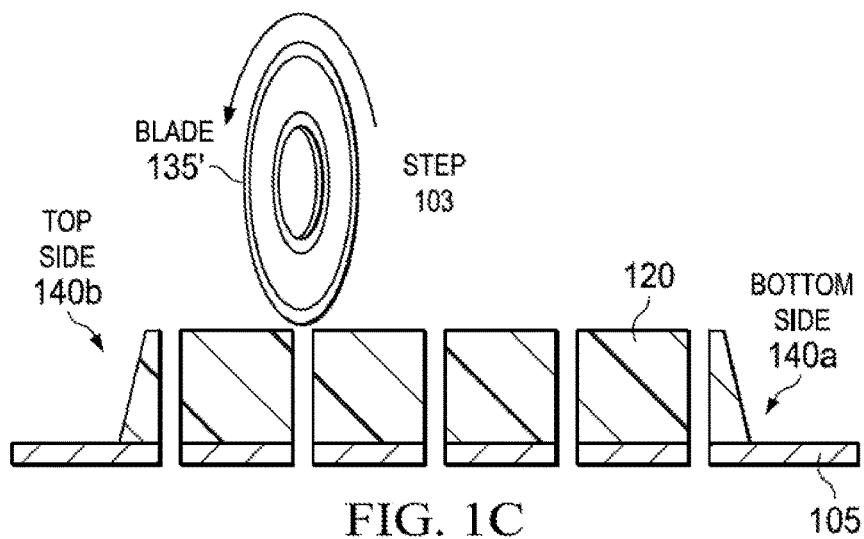

FIGS. 1A-1C depict steps in an example 2-cut method of forming a leadless packaged semiconductor device that solves the problem of removing burrs from leads and not reintroducing the burrs during subsequent processing, according to an example embodiment. FIG. 1A shows a saw blade (dicing blade) 135 on the lead side (bottom side) 140a of the in-process package 140 with the results of the first partial sawing (first sawing) shown as partial cuts 115 or "saw lanes" extending completely severing (through the thickness of) the leads with leads 105 identified in FIG. 1A, and through only a portion of the thickness of the mold compound 120, shown as an example being about ½ (50%) of the thickness of the mold compound 120. The first cut process is shown as step 101. The leadframe can comprise conventional copper or copper alloy and optionally include a plating layer.

Generally the partial cuts 115 into the package from the first cut is shallower compared to the second cut. The in-process package units being processed are generally in strip (or panel) form for ease of handling. Burrs resulting from the first sawing shown as burrs 110 are shown including within the partial cuts 115. For leads having corner recesses for implementing a wettable flank lead design, the burrs have a tendency to preferentially enter the recesses.

FIG. 1B depicts an example high pressure water treatment with water 122 shown dispensed from the nozzles of water injectors 125 as the de-flash process applied to the bottom side 140a of the package shown. The depiction is at the end of the de-flashing which removes the burrs 110 that are shown in FIG. 1A. This de-flashing is shown as step 102. For example, for the high pressure water treatment a pressure range of 500 to 900 kg/cm$^2$ may be used. The in-process package units for this de-flash process generally continue to be in strip (or panel) form again for ease of handling. Other de-flash processing can include cryogenic-based and laser-based processing. A de-flash cure can follow the de-flash process.

FIG. 1C shows the package portion after the second sawing (after the de-flash process) from the top side 140b of the package aligned to the partial cuts 115 that provides a cut to complete the partial cut 115 in the mold compound 120 from the top side 140b to singulate the package from the strip (or panel) without touching the pre-cut leads. The second sawing process is shown as step 103. Avoiding saw blade contact with the pre-cut leads avoids re-introducing burrs on the leads after being cleaning by de-flash processing.

Alignment for second sawing can be provided by guidance by the lines of the partial cuts 115. The blade 135' for the second cut process is thus aligned to the partial cuts 115. The blade 135' can be the same size as blade 135 used for the first sawing, or wider to provide a wider cut as compared to the first sawing. For example, the cut from the second sawing can be ≥0.025 mm wider as compared to the width of the partial cut lines 115 from the first partial sawing, with a width range of partial cuts 115 being 0.15 to 0.30 mm, and the width range of the second cuts being 0.20 mm to 0.35 mm. In another embodiment the second sawing can provide cuts ≥0.05 mm wider as compared to the width of the partial cuts 115.

Figure 2A:
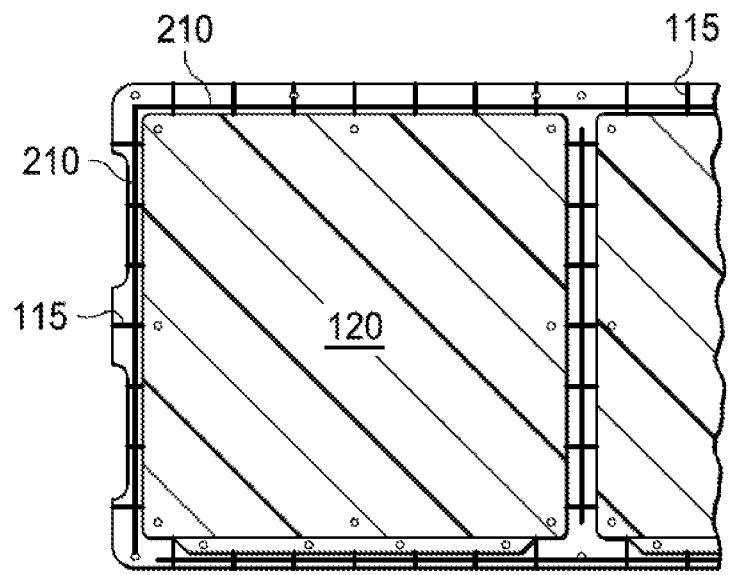
FIGS. 2A and 2B show examples structures for aligning the second (top side) cut to the first (bottom side, lead side) cut, according to an example embodiment.

Advantages of disclosed 2-cut methods of forming a leadless packaged semiconductor device include no need for new equipment, facility investment or change in lead-frame designs. Disclosed 2-cut methods are implementable with standard lead-frame designs. It is also possibly to extend disclosed methods to saw thicker packages. For aligning the first cut to the second cut two example alignment methods are described. FIG. 2A is a bottom side perspective depiction of a portion of a leadframe strip having partially assembled QFN devices with alignment features implementing a first example alignment option.

The partial cuts 115 created by the first cut process (step 101) are used as an alignment reference which ensures the second cut error tolerance is minimized. Here "dummy" cuts 210 (solely for alignment) on the leadframe each form an alignment mark (fiducial mark) which is consistent so that the second cut (step 103) will be aligned to partial cuts 115. When the first partial cut is offset, then the second cut will be aligned to this offset cut. The "dummy" cuts 210 can be performed either from top side or bottom side of the leadframe.

Figure 2B:
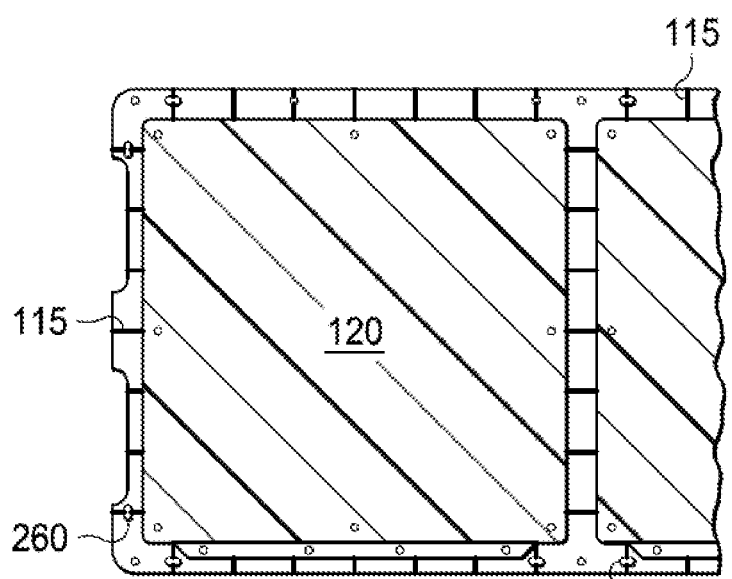

Dummy cuts 210 are generally made during forming the partial cuts 115 and thus will generally be the same dimensions as partial cuts 115. An option depicted in FIG. 2B which is a bottom perspective depiction of a portion of leadframe strip having partially assembled QFN devices has the alignment features 260 intercepting with the partial cut line, forming an align mark intercepting some of the cut lines. This second example alignment method comprises using the first cut line as a main reference for the second cut alignment. It has been found that fiducial marks using the same saw machine increase the alignment target score (a measure of the alignment accuracy) compared to only using partial cut line(s). This reduces the alignment fail error frequency on the saw machine. The leadframe design therefor may also include non-standard features intercepting the first saw line to form align mark as described above.

Figure 3:
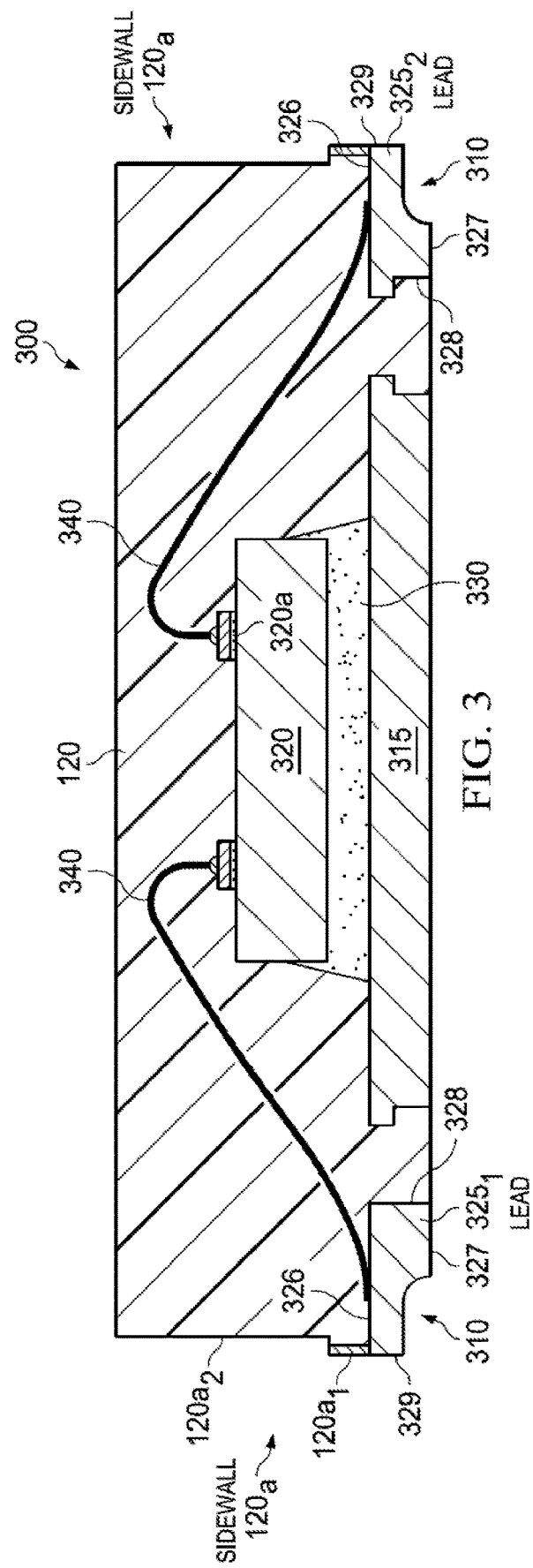
FIG. 3 is a cross sectional depiction of an example leadless packaged semiconductor device having a wettable flank lead design provided by a recess at the bottom corner region, according to an example embodiment.

FIG. 3 is a cross sectional depiction of an example leadless packaged semiconductor device 300 having a wettable flank lead design provided by a recess 310 at the bottom corner region of leads 325$_1$ and 325$_2$. The carrier for the leadframes can be a leadless carrier such as a Small Outline No-Lead (SON), Dual Flat No-Lead (DFN) or QFN carrier. Such leadless carriers form chip scale packages, which are characterized in that the leads thereof do not extend out from the package sides, thus reducing the overall package size.

The packaged semiconductor device 300 includes a leadless leadframe including a die pad 315, a semiconductor chip 320 attached to the die pad 315 by die attach material 330. The leadframe includes a plurality of leads shown as 325$_1$ and 325$_2$ that extend about the die pad 315, each of the leads defining an opposing top surface 326 and a bottom surface 327 having an inner end 328, an outer end 329, and side surfaces (not shown). The bottom surface 327 and outer end 329 collectively define a bottom corner region. Recess 310 originates in the bottom corner region where the bottom surface 327 and outer end 329 would intersect.

Electrically conductive bond wires 340 electrically connect to and extend between a bond pad 320a on the semiconductor chip 320 and respective leads 325$_1$ and 325$_2$. The semiconductor chip 320 can comprise two or more stacked die. A mold compound 120 having sidewalls 120a is around the die pad 315, the leads 325$_1$ and 325$_2$, the semiconductor chip 320, and the bond wires 340 such that the bottom surface 327 and outer end 329 as well as the sidewalls 120a of the mold compound 120 are exposed. The die pad 315 is shown exposed from the mold compound 120 to provide an exposed thermal pad for the packaged semiconductor device 300.

The sidewalls 120a include at least one of (i) a first tone for its bottom portion 120a$_1$ compared to a second tone different from the first tone for its top portion 120a$_2$, and (ii) where the bottom portion 120a$_1$ of the mold sidewall extends out beyond the top portion $120a_2$ of the mold sidewall, with both of these features (i) and (ii) being shown in FIG. 3. The first tone of the bottom portion $120a_1$ of the mold sidewall differentiated from the tone of the top portion $120a_2$ of the mold sidewall is due to the selective exposure of the bottom portion $120a_1$ to the de-flash process after first cut (and no de-flash exposure to the top portion $120a_2$). The tone difference can be observed using visible light viewing or a visible light inspection. In addition, as described above, wherein the second sawing provides a wider cut (e.g., by at least 0.05 mm) as compared to the partial cuts 115 provided by the first partial sawing, this results in the bottom portion of the package sidewall extending beyond the top sidewall which is yet another unique fingerprint for disclosed packaged semiconductor devices.

EXAMPLES

Disclosed embodiments are further illustrated by the following specific Examples, which should not be construed as limiting the scope or content of the claimed subject matter's scope" in any way.

Figure 4A:
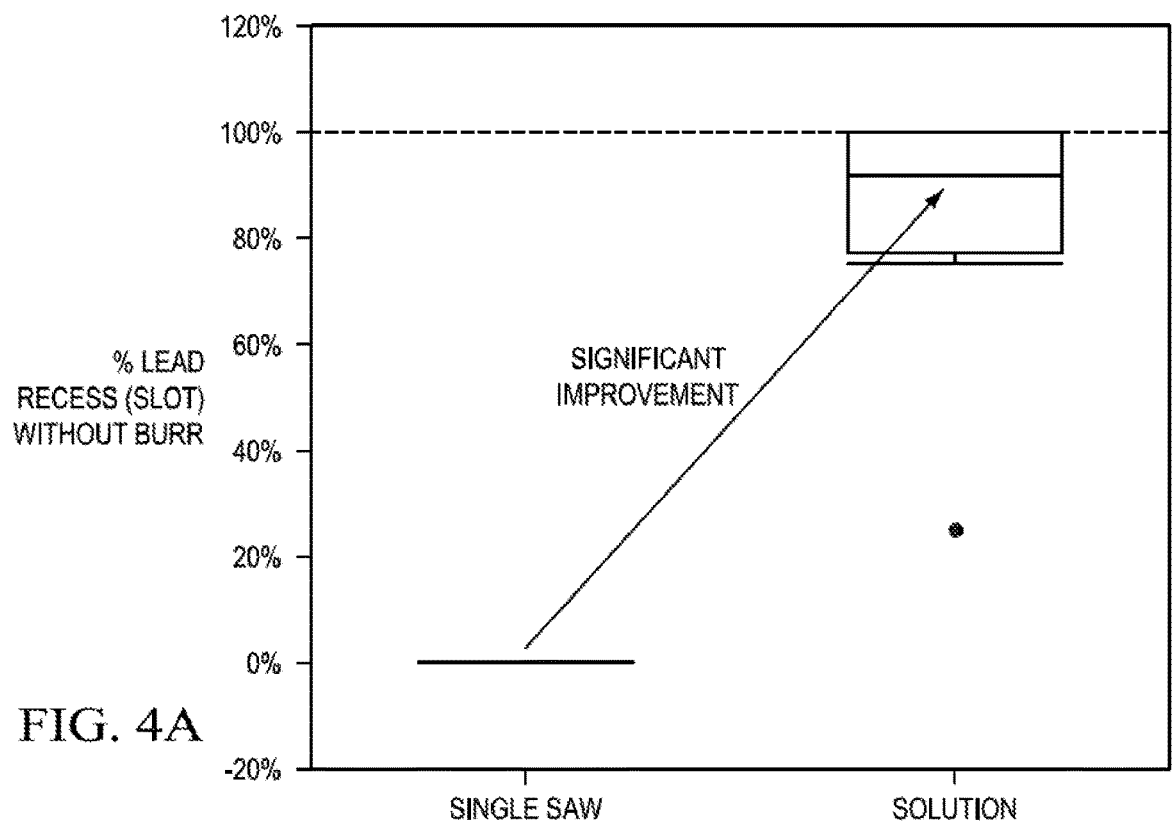
FIG. 4A shows example Visual Mechanical (VM) inspection derived data comprising the % of lead recesses without burrs and FIG. 4B shows the measured burr size and recess depth, both comparing control results from current single saw production to results from an example 2-cut method shown as the "solution" for processing a 48 lead QFN package.
Figure 4B:
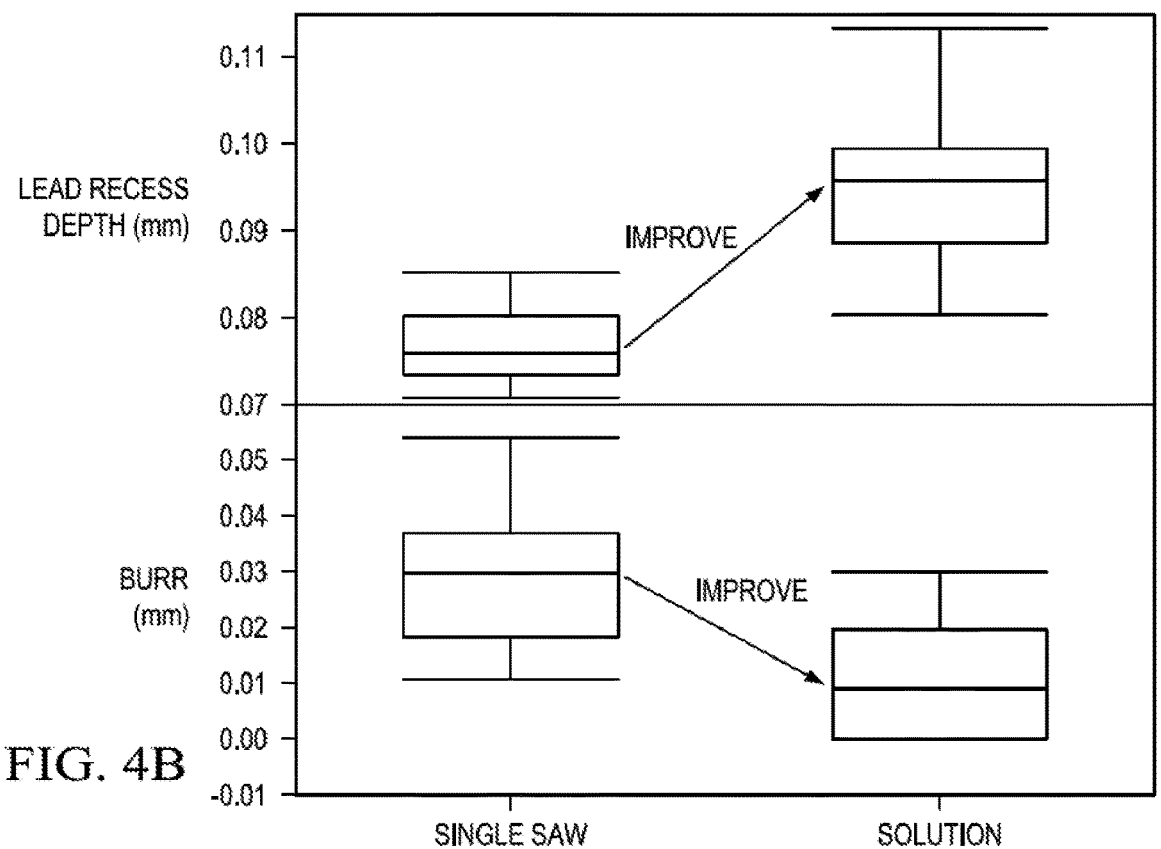

FIG. 4A shows example VM inspection derived data comprising the % of lead recesses without burrs and FIG. 4B the burr size and recess depth. Both FIGS. 4A and 4B compare a control being results from current single saw production to results from an example 2-cut method shown as the "solution" for a 48 lead QFN package. The y-axis in FIG. 4A is the % of lead recesses without burrs, with the disclosed 2-cut solution providing a near 100% value for lead recesses without burrs, with the single saw production process providing a value of only 0% to 20% for lead recesses without burrs. FIG. 4B shows burr size (mm) data and lead recess depth (mm) resulting from current single saw production and the disclosed 2-cut solution. The reduction in burrs provided by the 2-cut solution including in the burr size as shown translates into the increase in the measured recess depth shown.

Disclosed embodiments can be integrated into a variety of assembly flows to form a variety of different semiconductor IC devices and related products. The assembly can comprise single semiconductor chip or multiple semiconductor chips, such as package-on-package (PoP) configurations comprising a plurality of stacked semiconductor die. A variety of package substrates may be used. The semiconductor chip may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor chip can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming a packaged semiconductor device, comprising:
    first partial sawing a plurality of leads on a bottom side of an in-process semiconductor package having a top side opposite said bottom side, said in-process semiconductor package comprising a leadframe including a die pad, a semiconductor chip attached to said die pad, said plurality of said leads extending around said die pad each defining an opposing top and bottom surface and having an inner end, an outer end, wherein said bottom surface and said outer end collectively define a bottom corner region, at least one conductive bond wire electrically connected to and extending between a bond pad on said semiconductor chip and a respective one of said leads, a mold compound around said die pad, said leads, said semiconductor chip, and said conductive bond wire such that said bottom surface and said outer end are exposed, said first partial sawing completely severing said leads and forming only a partial cut in said mold compound;
    performing a de-flash process applied to said bottom side, aligning over said partial cuts for a second sawing from said top side, and
    said second sawing reaching said partial cuts to complete singulation of said in-process semiconductor package, wherein said second sawing does not touch said plurality of said leads.

2. The method of claim 1, wherein said bottom corner region includes a recess with respect to said outer end.

3. The method of claim 1, wherein said in-process semiconductor package comprises a plurality of in-process semiconductor packages that are coupled together on a common leadframe strip including a plurality of said leadframes.

4. The method of claim 1, wherein said de-flash process comprises a pressurized water treatment.

5. The method of claim 1, wherein said in-process semiconductor package comprises a Small Outline No-Lead (SON) or a Quad Flat No-Lead (QFN) package.

6. The method of claim 1, wherein said second sawing provides is a wider cut by at least 0.025 mm as compared to said partial cuts.

7. The method of claim 1, wherein said die pad is exposed from said mold compound.

8. The method of claim 1, wherein a mechanical saw is used for said first partial sawing and for said second sawing.

9. The method of claim 1, wherein a depth of said second sawing in said mold compound is deeper than a depth of said partial cut in said mold compound.

10. A method of forming a packaged semiconductor device, comprising:
    first partial sawing a plurality of leads on a bottom side of an in-process semiconductor package having a top side opposite the bottom side, the in-process semiconductor package comprising a leadframe including a die pad, a semiconductor chip attached to the die pad, the plurality of leads extending around the die pad, a mold compound contacting portions of the die pad, the plurality of leads, the semiconductor chip, the first partial sawing completely severing the plurality of leads and forming only a partial cut in the mold compound;
    performing a de-flash process applied to the bottom side, aligning over the partial cuts for a second sawing from the top side, and
    the second sawing reaching the partial cuts to complete singulation of the in-process semiconductor package, wherein the second sawing does not touch the plurality of the leads.

11. The method of claim 10, wherein each of the plurality of leads defines an opposing top and bottom surface and having an inner end, an outer end, wherein the bottom surface and the outer end collectively define a bottom corner region, at least one conductive bond wire electrically connected to and extending between a bond pad on the semiconductor chip and a respective one of said leads.

* * * * *